United States Patent
Sommer

(10) Patent No.: US 6,499,120 B1
(45) Date of Patent: Dec. 24, 2002

(54) USAGE OF REDUNDANCY DATA FOR DISPLAYING FAILURE BIT MAPS FOR SEMICONDUCTOR DEVICES

(75) Inventor: Michael Bernhard Sommer, Richmond, VA (US)

(73) Assignee: Infineon Technologies Richmond, LP, Sandston, VA (US)

( * ) Notice: Subject to any disclaimer, the term of this patent is extended or adjusted under 35 U.S.C. 154(b) by 0 days.

(21) Appl. No.: 09/476,450

(22) Filed: Dec. 30, 1999

(51) Int. Cl.⁷ .............................................. G01R 31/28
(52) U.S. Cl. ...................................................... 714/723
(58) Field of Search ................... 714/723, 42; 365/200, 365/201

(56) References Cited

U.S. PATENT DOCUMENTS

| | | | | |
|---|---|---|---|---|
| 5,720,031 A | * | 2/1998 | Lindsay | 714/42 |
| 5,917,764 A | * | 6/1999 | Ohsawa et al. | 365/200 |

OTHER PUBLICATIONS

Tanoi, BIST: Required for Embedded DRAM, IEEE, p. 1149, 1998.*
Tanoi et al., On–Wafer BIST of a 200Gb/s Failed–Bit Search for 1Gb DRAM, IEEE, p. 70–73, 1997.*

* cited by examiner

*Primary Examiner*—Albert Decady
*Assistant Examiner*—Shelly A Chase
(74) *Attorney, Agent, or Firm*—Stanton Braden

(57) ABSTRACT

A method for displaying failure information for semiconductor devices, in accordance with the present invention, includes testing a semiconductor device with a tester to determine failures, and performing a redundancy calculation to repair the failures. The results of the redundancy calculation are stored in a file which identifies only addresses of components which have failed. The file is converted to a display format and the display format is displayed to provide a bit fail map for the semiconductor device such that sparse failures are displayed in addition to row and column failures without employing the tester to regenerate fail data.

24 Claims, 3 Drawing Sheets

Total BIN data   = 2
 Row line count   = 59
 Row address     =
        1|  001010D8  001010DC  0000004C  00001260  00001258  00001068  00001254
 00101400
        9|  00100590  000014F8  000004B8  00100824  00101ADC  00001898  00000CE0
 00000CDC
       17|  00000D2C  00000D28  003001B4  003002A0  00301088  00300530  00300538
 00301540
       25|  00200FC8  00200FC4  00200DE4  005003C8  005003C4  005011EC  004000F8
 00401140
       33|  0040113C  004013CC  005015CC  00400458  005018C4  00500C84  00500C80
 00501F64
       41|  01500FFC  00400E24  00400E20  00401C3C  00401D08  00701100  007000C0
 007011E0
       49|  00600024  0060116C  006013E4  00600604  00700574  00700570  006018C4
 00601904
       57|  00600894  00600E20  00600E68
 Column line count=  31
 Column address  =
        02000000  00000000  02010000  00010000  02020000  00020016  00020000
 02030000
           00030000  00030002  002401FC  002401FE  002401FA  00210096  00230008
 0023006A
           00230170  002701FE  002701FC  02400000  00400000  004400AC  02410000
 02420000
           004201E8  02430000  02470006  006400AC  006400B6  006401FC  0065014E
 Limit flag         = 00000000
 <<<Sparse fail address>>>
 Repaired sparse fail count     = 297           x      y
 Repaired sparse fail address   =
        1|  001002D4, 02140000  001002B8, 02140000  00101200, 02140000
 00101210, 02140000
        5|  00101260, 02140000  00101280, 02140000  0010135C, 02140000
 011013FC, 00140000
        9|  00101108, 02140000  00101168, 02140000  00101188, 02140000
 00101318, 02140000
       13|  00101348, 02140000  001013C0, 02140000  001002E0, 02140000
 001013F8, 02140000
       17|  011013FC, 02140000  0010129C, 02140000  011013FC, 02140000
 000003E8, 02000000

FIG. 2

USAGE OF REDUNDANCY DATA FOR DISPLAYING FAILURE BIT MAPS FOR SEMICONDUCTOR DEVICES

BACKGROUND

1. Technical Field

This disclosure relates to semiconductor testing and more particularly, to a method for providing failure bit maps from redundancy data for semiconductor devices.

2. Description of the Related Art

Semiconductor devices, especially memory devices, are typically tested by generating a pattern of inputs and transferring the pattern of inputs to the array of memory cells. The data written to the memory cells is then retrieved and compared to the input pattern to identify abnormalities or failures. The failures of the cells are stored in a tester in an address failure memory and correlated to repair the failures by replacing failed cells with redundancies. Typically, a tester provides a failure redundancy latch map (FRL) with 256 regions associated with the amount of input/output ports (I/O's) regardless of the size of the device. This results in further limitations on the map's capabilities for displaying a bit map.

In typical set ups, a complete test sequence is run on the tester to identify failures, which are stored in an address fail memory, and perform redundancy calculations. Then, to provide a bit map of the failures, the data in the address fail memory is dumped to a file to recollect the test data for the bit map. In some cases the entire chip or wafer must be retested to retrieve the data. This dumping process may be very time consuming, and increases test time. Further, to reduce time specialized software programs are needed to reduce this dumping time. These specialized programs tend to be very expensive.

Therefore, a need exists for a method of providing a bit map which utilizes redundancy data in a first test run to generate a bit map display while eliminating the time needed for additional data transfers.

SUMMARY OF THE INVENTION

A method for displaying failure information for semiconductor devices, in accordance with the present invention, includes testing a semiconductor device with a tester to determine failures, performing a redundancy calculation to repair the failures, storing results of the redundancy calculation in a file which identifies only addresses of components which have failed, converting the file to a display format and displaying the display format to provide a bit fail map for the semiconductor device such that sparse failures are displayed in addition to row and column failures without employing the tester to regenerate fail data.

In alternate methods, the step of adjusting a resolution of the bit fail map by programming a repair control file may be included. The resolution may be adjusted to display single cell failures. The file provided by the redundancy calculation may include binary data. The step of converting the file to a display format may include the step of employing an automatic pattern recognition program (APRC) to translate the file. The method may further include the step of analyzing the display to identify locations of failures. The steps of storing results of the redundancy calculation and displaying the display format are preferably performed during a single test run of a production test. This provides the bit map data without having to regenerate the data. The step of displaying the display format may include displaying column failures, row failures and spares failures on a same map. The step of converting the file to a display format may include manually assigning reference addresses to provide a method for displaying the data. The above methods may be implemented by a program storage device readable by machine, tangibly embodying a program of instructions executable by the machine to perform method steps for displaying failure information after testing a semiconductor device for failures.

Another method for displaying failure information for a semiconductor memory device includes the steps of testing a semiconductor memory device to determine failures in a memory array of the device, performing a plurality of tests, each test followed by a redundancy calculation to repair the failures of the test, storing results of each redundancy calculation in a binary file which identifies component failure due to the tests, wherein the redundancy calculation results include row addresses, column address and sparse failure addresses, converting the binary file to a display format using an automatic pattern recognition program (APRC) and displaying the display format on a monitor to provide a bit fail map for the semiconductor device.

In other methods, the step of analyzing the display may be included. The steps of storing results of the redundancy calculation and displaying the display format to provide a bit fail map for the semiconductor device may be performed during a single test run of a production test. The step of displaying the display format to provide a bit fail map for the semiconductor device may include displaying column failures, row failures and sparse bit failures on a same map. The step of adjusting a resolution of the bit fail map by programming a repair control file may be included. The resolution may be adjusted to display single cell failures.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein:

FIG. 2 is an illustrative output of a redundancy data file before being translated to a display format in accordance with the present invention.

DETAILED DESCRIPTION OF PREFERRED EMBODIMENTS

The present invention provides a method for employing redundancy data to create a bit fail map display. In this way, failure data obtained during a production test of a semiconductor device may be displayed without having to reinitialize and rerun the production test. By advantageously, employing the redundancy data a bit map is provided while reducing the amount of processing time needed to obtain a display of the fail data.

Figure 1:
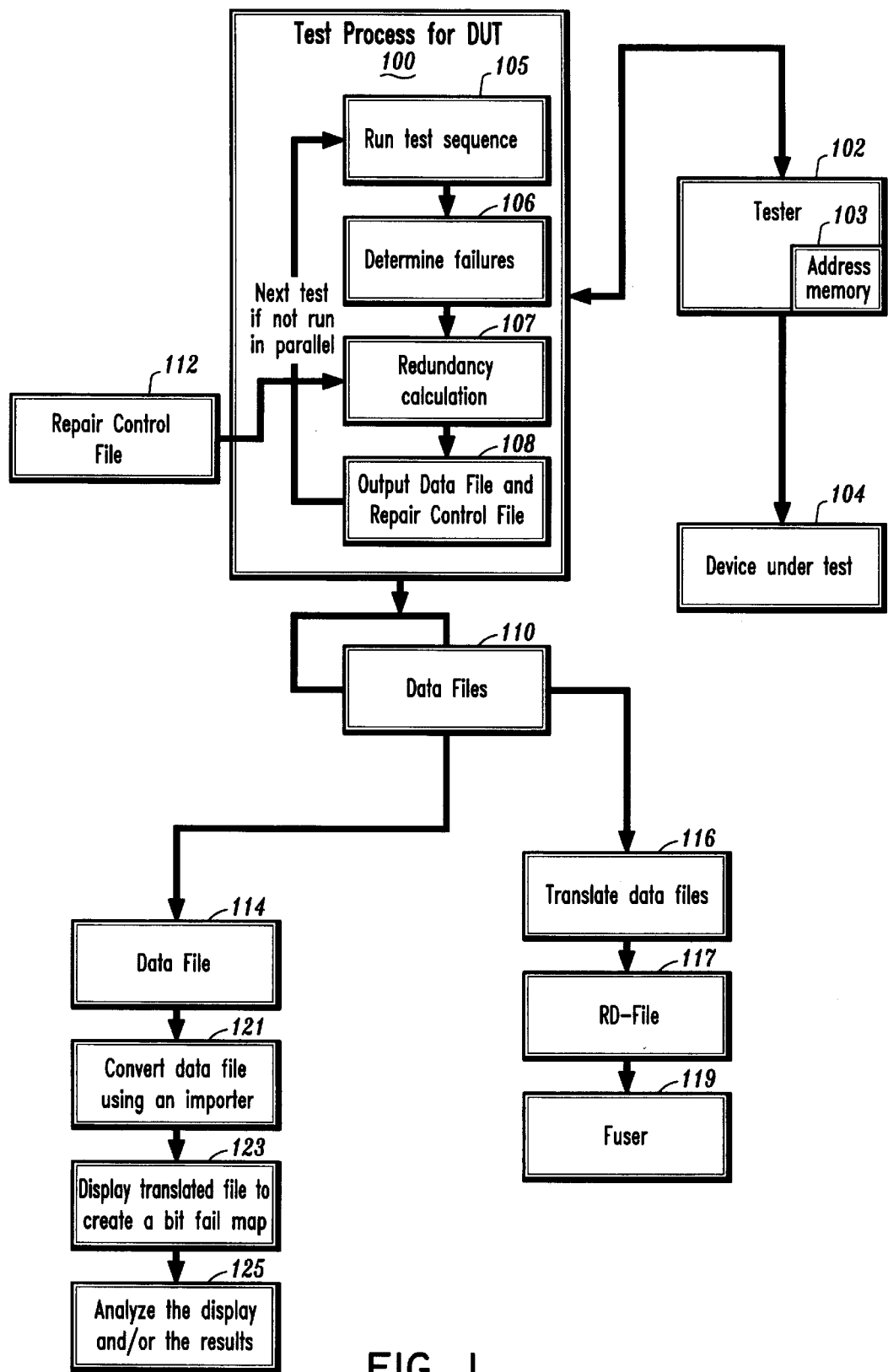
FIG. 1 is a block/flow diagram of a system/method for displaying failure information for semiconductor devices by employing redundancy data in accordance with the present invention.

It should be understood that the elements shown in the FIG. 1 may be implemented in various forms of hardware, software or combinations thereof. Preferably, these elements are implemented on one or more appropriately programmed general purpose digital computers having a processor and memory and input/output interfaces. Referring now in specific detail to the drawings in which like reference numerals identify similar or identical elements throughout the several views, and initially to FIG. 1, a block/flow diagram is shown for creating a bit map display from redundancy data. In block 100, a tester 102 is employed to test a semiconductor wafer 104 (or Device Under Test (DUT)) for failures. Tester 102 includes a pattern generator and a scrambler and other modules or devices for inputting data patterns to a memory array on DUT 104. Other tests may be run as well to determine whether components on DUT 104 have failed. Tester 102 includes an address fail memory 103 which stores data on passed and failed devices and/or cells on DUT 104.

In one embodiment, tester 102 employs different test sequences to determine failures of components on DUT 104. In this way, a first test sequence is run in block 105, failures are determined in block 106 and a redundancy calculation is preformed in block 107 for that test sequence. These steps may be repeated for other tests. Each test sequence outputs a data file 110 from block 108. Blocks 105, 106, 107 and 108 may be run in parallel, e.g., run concurrently to reduce time. For example, during testing in block 105, failures are determined and the redundancy calculation may be begun in block 107 at the same time. A new test sequence may be initiated before the previous test sequence has ended. A repair control file (RFC) 112 is employed during the redundancy calculation to assign appropriate redundant components, check dependencies and requirements associated with assigning redundant regions and controlling and tracking other related information.

Block 106 records pass/fail data in address fail memory 103 of tester 102. Advantageously, output data files 110 (See e.g., FIG. 2) generated in block 108 are output with only addresses of failed components and are combined in a single data file 114. Data file 114 includes data for all components, which include failures associated with the redundancy calculation of block 107. Data file 114 includes addresses of replaced "sparse failures" or individual memory cells. Sparse fail addresses include both x and y components in the memory array. Sparse failures may include one or more memory cells that are grouped according to redundancy calculation requirements controlled by a repair control file 112. Data file 114 may also include row and column addresses (either x or y address values) which identify the row or column failures which have been discovered by testing. In a production test program up to 5 arbitrary redundancy calculations may be performed. Each redundancy calculation results in a data file 110. Touch down files may also be generated to identify individual chips, which have been tested on a wafer. This may result in several data files 114, one for each chip on a wafer.

In conventional systems, data files 110 may include a binary file that is read and deleted by post-processing to create fuse string or RD-file (redundancy data file) 117. The deletion of the data is both time consuming and inefficient as described above. The data read from data files 110 is processed by a memory repair algorithm in block 116 which converts the address data to row and column addresses for repair by a fuser 119. Repair Control File (RFC) 112 describes the way the redundancy calculation is performed and how the data is stored in RD-file 117. With the RCF 112, the RD-file 117 includes AMUST@ repair addresses of rows and columns with x and y coordinates. AMUST@ repairs are row-oriented or column-oriented fails that cannot be repaired by the provided amount of redundant columns or redundant rows. By increasing the number of available redundant rows and redundant columns, any AMUST@ repairs can be prevented. This would alleviate any problems caused by employing redundant rows and redundant columns, which would be used to repair failures in the RD-file 117.

In block 116, translation of the RD-file 117 may be performed by employing the memory repair algorithm to convert the binary data of data files 110 into a useful format for fuser 119, for example, an ASCII format or a "waf" file. Fuser 119 is employed to program fuses to enable/disable rows and columns to repair DUT 104.

Since information about, rows, columns, and sparse failures is available, the information is gathered in data file 114 and may now be displayed. In accordance with the present invention, data files 110 are stored in data file 114. The data included in file 114 is imported to an importer 121 for a display method. Importer 121 reads data file 114 to obtain failure address information and assigns a pixel address or addresses to the failure address to provide a converted file. The data is then displayed in block 123.

In block 123, the converted data file 114 is displayed. In one example, converted data file 114 is provided in a format compatible with commercially available display software. The translated file is then displayed, for example on a monitor, thereby creating a bit fail map for device under test 104. Importing data file 114 results in maps with failing whole bit lines or word lines. One advantage of the use of data file 114 is availability of single bit fail information, which is typically not available for conventional bit maps. Single bit failures may be obtained by adjusting the resolution of the repair control file 112 during redundancy calculations. By choosing redundancy size of a single cell, a complete bit map can be obtained.

Importer 121 may employ an automatic pattern recognition program (APRC) to first identify the address information in data file and then apply an algorithm to appropriately assign display addresses to the data. APRC identifies data fields, such as x, y coordinate data fields, and places then into a useful format, e.g., so the addresses may be read and converted. Address conversion may be performed by an algorithm or with the assistance of a manual address conversion operation. For example, by providing user defined start and finish addresses as reference points and then automatically assigning remaining address to pixel locations.

Since the redundancy calculation is performed by tester 102, it would be advantageous to perform the redundancy calculation and employ the results thereof to generate a bit fail map without rerunning the testing sequence. In this way, both redundancy data files are generated and a display of the details of the redundancy calculation are achieved. Advantageously, test time is gained as the redundancy calculation information is available for displaying a bit map without having to rerun the test sequence. This is contrary to the conventional bit map procedure, which may require a new testing sequence or a time consuming dumping procedure. The conventional bit map also consumes additional time in being generated. Therefore, test time reduction is a further advantage of the present invention.

In block 125, the translated file is employed for additional analysis. For example, KNIGHT Analysis may be performed to compare process limited yield (PLY) data for the detection of particles on a wafer.

Referring to FIG. 2, a data file 200 is shown. Data file 200 includes addresses for failed rows 204, columns 206 and sparse failures 208 (or individual cell failures). Note that sparse failures include both x and y coordinates. Redundancy data file 200 is an illustrative example of a data file 110 described above with reference to FIG. 1.

Figure 3:
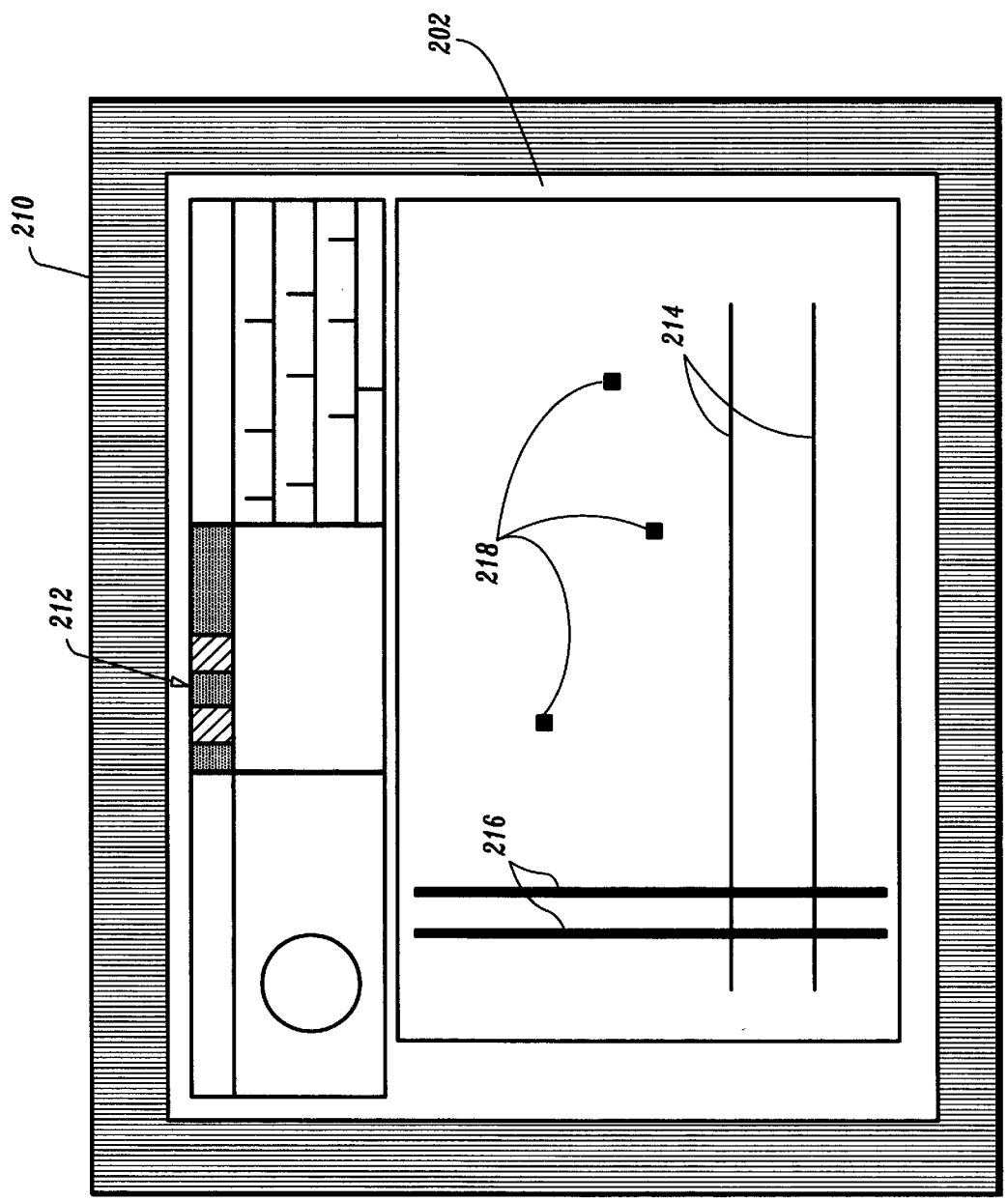
FIG. 3 depicts a monitor having a displayed bit map in accordance with the present invention.

Referring to FIG. 3, redundancy data file 200 is shown in display 202 in accordance with the present invention. Data file 200 is displayed on a monitor 210. Monitor 210 displays a screen which includes a graphical user interface (GUI) 212 which permits a user to interact with a displayed redundancy data file 200 in accordance with the invention. GUI 212 may provide virtual controls for accessing analysis software or tools. Note that the displayed data file 200 includes failed rows 214, columns 216 and sparse failures 218.

Having described preferred embodiments usage of redundancy data for displaying failure bit maps for semiconductor devices (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for displaying failure information for semiconductor devices comprising the steps of:

testing a semiconductor device with a tester to determine failures;

performing a redundancy calculation to repair the failures;

storing results of the redundancy calculation in a file which identifies only addresses of components which have failed;

converting the file to a display format; and displaying the display format to provide a bit fail map for the semiconductor device such that sparse failures are displayed in addition to row and column failures without employing the tester to regenerate fail data.

2. The method as recited in claim 1, further comprising the steps of adjusting a resolution of the bit fail map by programming a repair control file.

3. The method as recited in claim 2, wherein the resolution is adjusted to display single cell failures.

4. The method as recited in claim 1, wherein the file includes binary data.

5. The method as recited in claim 4, wherein the step of converting the file to a display format includes the step of employing an automatic pattern recognition program (APRC) to translate the file.

6. The method as recited in claim 1, further comprising the step of analyzing the display to identify locations of failures.

7. The method as recited in claim 1, wherein the steps of storing results of the redundancy calculation and displaying the display format are performed during a single test run of a production test.

8. The method as recited in claim 1, wherein the step of displaying the display format includes displaying column failures, row failures and spares failures on a same map.

9. The method as recited in claim 1, wherein the steps of converting the file to a display format includes manually assigning reference addresses.

10. A program storage device readable by machine, tangibly embodying a program of instructions executable by the machine to perform method steps for displaying failure information after testing a semiconductor device for failures, the method steps comprising:

testing a semiconductor device with a tester to determine failures;

performing a redundancy calculation to repair the failures;

storing results of the redundancy calculation in a file which identifies only addresses of components which have failed;

converting the file to a display format; and displaying the display format to provide a bit fail map for the semiconductor device such that sparse failures are displayed in addition to row and column failures without employing the tester to regenerate fail data.

11. The program storage device as recited in claim 10, further comprising the steps of adjusting a resolution of the bit fail map by programming a repair control file.

12. The program storage device as recited in claim 11, wherein the resolution is adjusted to display single cell failures.

13. The program storage device as recited in claim 10, wherein the file includes binary data.

14. The program storage device as recited in claim 13, wherein the step of converting the file to a display format includes the step of employing an automatic pattern recognition program (APRC) to translate the file.

15. The program storage device as recited in claim 10, further comprising the step of analyzing the display to identify locations of failures.

16. The program storage device as recited in claim 10, wherein the steps of storing results of the redundancy calculation and displaying the display format are performed during a single test run of a production test.

17. The program storage device as recited in claim 10, wherein the step of displaying the display format includes displaying column failures, row failures and spares failures on a same map.

18. The program storage device as recited in claim 10, wherein the steps of converting the file to a display format includes manually assigning reference addresses.

19. A method for displaying failure information for a semiconductor memory device comprising the steps of:

testing a semiconductor memory device to determine failures in a memory array of the device;

performing a plurality of tests, each test followed by a redundancy calculation to repair the failures of the test;

storing results of each redundancy calculation in a binary file which identifies component failure due to the tests, wherein the redundancy calculation results include row addresses, column address and sparse failure addresses;

converting the binary file to a display format using an automatic pattern recognition program (APRC); and displaying the display format on a monitor to provide a bit fail map for the semiconductor device.

20. The method as recited in claim 19, further comprising the step of analyzing the display.

21. The method as recited in claim 19, wherein the steps of storing results of the redundancy calculation and displaying the display format to provide a bit fail map for the semiconductor device are performed during a single test run of a production test.

22. The method as recited in claim 19, wherein the step of displaying the display format to provide a bit fail map for the semiconductor device includes displaying column failures, row failures and sparse bit failures on a same map.

23. The method as recited in claim 19, further comprising the steps of adjusting a resolution of the bit fail map by programming a repair control file.

24. The method as recited in claim 23, wherein the resolution is adjusted to display single cell failures.

* * * * *